US010593577B2

(12) United States Patent
Raschke et al.

(10) Patent No.: US 10,593,577 B2
(45) Date of Patent: Mar. 17, 2020

(54) SUBSTRATE CONTAINER WITH WINDOW RETENTION SPRING

(71) Applicant: Entegris, Inc., Billerica, MA (US)

(72) Inventors: Russ V. Raschke, Chanhassen, MN (US); Jason T. Steffens, Shakopee, MN (US)

(73) Assignee: Entegris, Inc., Billerica, MA (US)

( * ) Notice: Subject to any disclaimer, the term of this patent is extended or adjusted under 35 U.S.C. 154(b) by 9 days.

(21) Appl. No.: 15/480,736

(22) Filed: Apr. 6, 2017

(65) Prior Publication Data

US 2017/0294326 A1 Oct. 12, 2017

Related U.S. Application Data

(60) Provisional application No. 62/319,120, filed on Apr. 6, 2016.

(51) Int. Cl.
*H01L 21/673* (2006.01)
*H01L 21/67* (2006.01)

(52) U.S. Cl.
CPC .. *H01L 21/67379* (2013.01); *H01L 21/67011* (2013.01); *H01L 21/67359* (2013.01); *H01L 21/67373* (2013.01); *H01L 21/67376* (2013.01); *H01L 21/67393* (2013.01)

(58) Field of Classification Search
CPC ......... H01L 21/67379; H01L 21/67011; H01L 21/67359; H01L 21/67373; H01L 21/67376; H01L 21/67393
USPC ............ 206/710–712, 832, 454; 40/700–799
See application file for complete search history.

(56) References Cited

U.S. PATENT DOCUMENTS

| 648,523 A * | 5/1900 | Pierce ...................... A47G 1/06 40/795 |
| 4,217,710 A * | 8/1980 | Becker ................. A47G 1/0638 248/488 |
| 4,235,030 A * | 11/1980 | Astolfi ................. A47G 1/0605 40/792 |
| 4,953,312 A * | 9/1990 | Astolfi ..................... A47G 1/06 40/790 |
| 5,590,787 A * | 1/1997 | Hodges ............ H01L 21/67346 206/460 |
| 5,659,990 A * | 8/1997 | Henneman ............... A47G 1/06 40/790 |
| 6,216,873 B1 * | 4/2001 | Fosnight ................... G03F 1/66 206/454 |
| 7,607,543 B2 | 10/2009 | Gregerson et al. |

(Continued)

FOREIGN PATENT DOCUMENTS

TW 201523126 A 6/2015

*Primary Examiner* — Chun Hoi Cheung
(74) *Attorney, Agent, or Firm* — Entegris, Inc.

(57) ABSTRACT

A reticle container for containing a reticle including a base plate having one or more windows. Each of the windows can include mounting recess having a recess sidewall including an undercut defined therein. A transparent substrate can be disposed in the mounting recess and is retained therein by a retention member having an arcuate portion extending between a first end portion and a second end portion. At least the first end portion of the retention member can be positioned in the undercut defined in the recess sidewall such that the arcuate portion of the retention member contacts the transparent substrate to retain the transparent substrate in the mounting recess.

15 Claims, 9 Drawing Sheets

(56) References Cited

U.S. PATENT DOCUMENTS

| | | | |
|---|---|---|---|
| 8,220,630 B1* | 7/2012 | Ku | G03F 7/70741 |
| | | | 206/454 |
| 8,231,005 B2 | 7/2012 | Kolbow et al. | |
| 9,919,863 B2* | 3/2018 | Lystad | H01L 21/67359 |
| 2004/0231110 A1* | 11/2004 | Hutter, III | B65D 63/1036 |
| | | | 24/16 PB |
| 2012/0175279 A1* | 7/2012 | Ku | G03F 1/66 |
| | | | 206/454 |
| 2015/0266660 A1 | 9/2015 | Lystad et al. | |

* cited by examiner

SUBSTRATE CONTAINER WITH WINDOW RETENTION SPRING

CROSS-REFERENCE TO RELATED APPLICATION

This application claims the benefit of U.S. Provisional Application No. 62/319,120 filed on Apr. 6, 2016 and entitled "Substrate Container with Window Retention Spring", which is incorporated herein by reference in its entirety for all purposes.

TECHNICAL FIELD

This disclosure relates generally to a container for storage, transport, shipping and processing of fragile devices such as photomasks, reticles, printed circuit boards and substrates.

BACKGROUND

One of the process steps commonly encountered in the fabrication of integrated circuits and other semiconductor devices is photolithography. Broadly, photolithography involves selectively exposing a specially prepared wafer surface to a source of radiation using a patterned template to create an etched surface layer. Typically, the patterned template is a reticle, which is a very flat glass plate that contains the patterns to be reproduced on the wafer. For example, the wafer surface may be prepared by first depositing silicon nitride on it followed by a coating of a light-sensitive liquid polymer or photoresist. Next, ultraviolet (UV) light is shone through or reflected off a surface of a mask or reticle to project the desired pattern onto the photoresist-covered wafer. The portion of the photoresist exposed to the light is chemically modified and remains unaffected when the wafer is subsequently subjected to a chemical media that removes the unexposed photoresist leaving the modified photoresist on the wafer in the exact shape of the pattern on the mask. The wafer is then subjected to an etch process that removes the exposed portion of the nitride layer leaving a nitride pattern on the wafer in the exact design of the mask. This etched layer, singly or in combination with other similarly created layers, represent the devices and interconnects between devices characterizing the "circuitry" of a particular integrated circuit or semiconductor chip.

With extreme ultraviolet (EUV) photolithography, reflection from the patterned surface is used as opposed to transmission through the reticle characteristic of deep ultraviolet light photolithography. Consequently, the reflective photomask (reticle) employed in EUV photolithography is susceptible to contamination and damage to a far greater degree than reticles used in conventional photolithography. Particulate contamination of the surface of the reticle can compromise the reticle to a degree sufficient to seriously affect any end product obtained from the use of such a reticle during processing. Particles can be generated within the controlled environment containing the reticle during processing, transport and shipping. Sliding friction between the reticle and the container and between the components of the container are also sources of contaminating particulates. Also, it is now known that gases and minute quantities of moisture can escape from the polymer materials used in reticle containers, which can cause haze and crystal growth on reticles damaging the same.

SUMMARY

This disclosure relates generally to a container for storage, transport, shipping and processing of fragile devices such as photomasks, reticles, printed circuit boards and substrates.

In one illustrative embodiment, a substrate container comprising can include a base plate and a cover. The cover can be adapted to engage the base plate to define an enclosure, and the base plate can include including at least one window. The at least window can include: a mounting recess including a recess sidewall, a bottom sidewall, and at least undercut defined recess sidewall, wherein together the recess sidewall and the bottom sidewall define a lip; a transparent substrate disposed in the mounting recess, and a retention member having an arcuate portion extending between a first end portion and a second end portion, wherein the first end portion is positioned in the undercut defined in the recess sidewall and wherein the arcuate portion of the retention member contacts the transparent substrate to retain the transparent substrate in the mounting recess.

In another illustrative embodiment, a substrate container can include an outer pod assembly and an inner pod assembly contained with the outer pod assembly. The inner pod assembly can include a base plate and a cover. The base plate has an upwardly facing surface and a downwardly facing surface and can include a plurality of windows. Each of the windows can include: a mounting recess having a first and second recess sidewalls, a second first and second bottom sidewalls, first and second undercuts defined in each of first and second sidewalls, wherein together the first and second recess sidewalls and first and second bottom sidewalls defined a lip; an aperture defined by the bottom sidewall of the mounting recess; a transparent substrate disposed in the mounting recess and supported by the lip; and a retention member having a pair of arcuate portions extending from a first end portion to a second end portion, wherein the first end portion is positioned in the first undercut defined in the first recess sidewall, the second end portion is positioned in the second undercut defined in the second recess side walls and wherein the pair of arcuate portions of the retention member contact the transparent substrate to retain the transparent substrate in the mounting recess. In a particular embodiment, the retention member is fabricated from spring steel.

In still yet another illustrate embodiment, a method includes: placing a transparent substrate into mounting recess defined in a base plate of a substrate container. The mounting recess can include first and second recess sidewalls, first and second bottom sidewalls, undercuts defined in each of the first and second recess sidewall, wherein together the first and second recess sidewalls and the first and second bottom sidewalls define a lip on which the transparent substrate is supported. Next, the method can include inserting a first end portion of a retention member into a first undercut defined in the first recess sidewall, the retention member including an arcuate portion extending from the first end portion to a second end portion. This can be followed by: compressing the second end portion of the retention member in a direction towards a center line of the retention member; inserting the second end portion into a second undercut defined in the second recess side wall; and releasing the compressed second end portion, wherein the arcuate portion contacts the transparent substrate to retain the transparent substrate within the mounting recess.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings.

Figure 1:
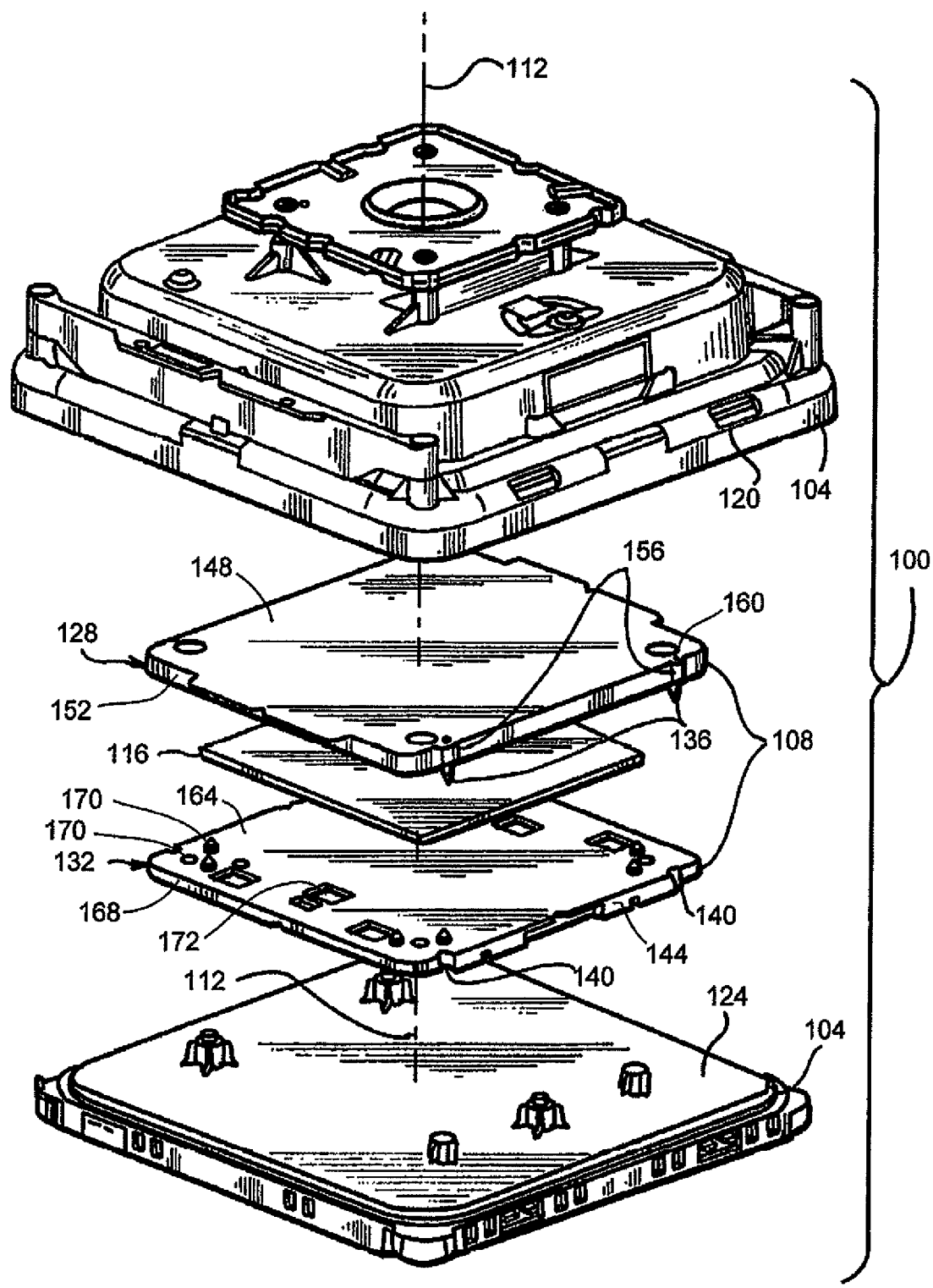
FIG. 1 depicts a reticle container of the prior art.

While the embodiments of the disclosure are amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment may be incorporated into an additional embodiment unless clearly stated to the contrary.

FIG. 1 depicts a reticle container 100 of the prior art. The reticle container 100 includes an outer pod assembly 104 and an inner pod assembly 108 aligned with a central axis 112, the inner pod assembly 108 containing a reticle 116. As used herein, the term reticle 116 refers to a thin planar substrate, reticle, or printed circuit board. The outer pod assembly 104 includes an upper portion 120 and a lower portion 124 that cooperate to define an enclosure. The inner pod assembly 108 includes a cover 128 and a base 132 and can be disposed within the outer pod assembly 104. The cover 128 and the base 132 can be aligned by alignment pins 136 that extend from the cover 128. Each alignment pin 136 can be positioned within a respective guide recess 140 formed on an edge 144 of the base 132. While the reticle pods depicted herein are of a generally square outline, it is understood that other pods can have other shapes such as for example, a polygonal, circular, or other suitable shape.

The inner pod assembly cover 128 can be of unitary construction, machined from a single block (e.g., a metal such as stainless steel). The cover 128 defines a top surface 148 opposite a bottom or interior-facing surface spaced apart from the top surface 148 with a lateral surface 152 extending substantially along a plane. In one embodiment, the cover 128 can be provided with at least one protrusion 156, the protrusion 156 extending outward from the lateral surface 152 and extending from the top surface 148 to the bottom surface. A through hole 160 is formed at a location in the protrusion 156 for receiving the alignment pin 136. An axis of the through hole 160 is substantially perpendicular to the top surface 148. It is further contemplated that the cover 128 could be provided without the protrusion 156 and the through hole 160 be drilled substantially adjacent the lateral surface 152. The alignment pin 136 can be dimensioned for an interference fit with the hole 160.

The inner pod assembly base 132 can also be of unitary metallic construction and includes an upwardly-facing or interior-facing surface 164 opposite a downwardly-facing or bottom surface with a lateral surface 168 extending therebetween, the lateral surface 168 lying substantially along a plane. The base 132 includes a plurality of reticle support members 170 extending from on the interior-facing surface 164 for supporting the reticle 116 within the inner pod assembly 108 near each of its corners. The base 132 can be provided with at least one guide recess 140, the guide recess 140 receding inward from the plane of the lateral surface 168 and extending through the top surface 164 and the bottom surface. In one embodiment, the guide recess 140 is positioned on the base 132 such that when the cover 128 is in engagement with the base 132, the alignment pin 136 is located at a precise location within the guide recess 140 resulting in a close mating engagement between the alignment pin 136 and the guide recess 140. The base 132 additionally includes a plurality of windows 172 each including a transparent substrate that is disposed in the base 132 for monitoring the reticle from outside the inner pod assembly 108 via the windows 172.

Functionally, the cover 128 and base 132 mate with each other to define a sealed enclosure having insubstantial axial movement therebetween. The seal defined between the cover 128 and the base 132 is robust so as to prevent the entry of undesirable contaminants and other contaminant matter into the microenvironment defined by the sealed enclosure. The formation of unitary structures for the cover 128 and base 132 eliminates or reduces the presence of surfaces that are brought into clamping contact, thereby reducing or eliminating the entrapment of particles between such clamped surfaces and the attendant shedding of particles that can occur over time. The unitary construction also eliminates manufacturing steps and reduces the tolerance buildup associated with the cover 128 and base 132.

Figure 2:
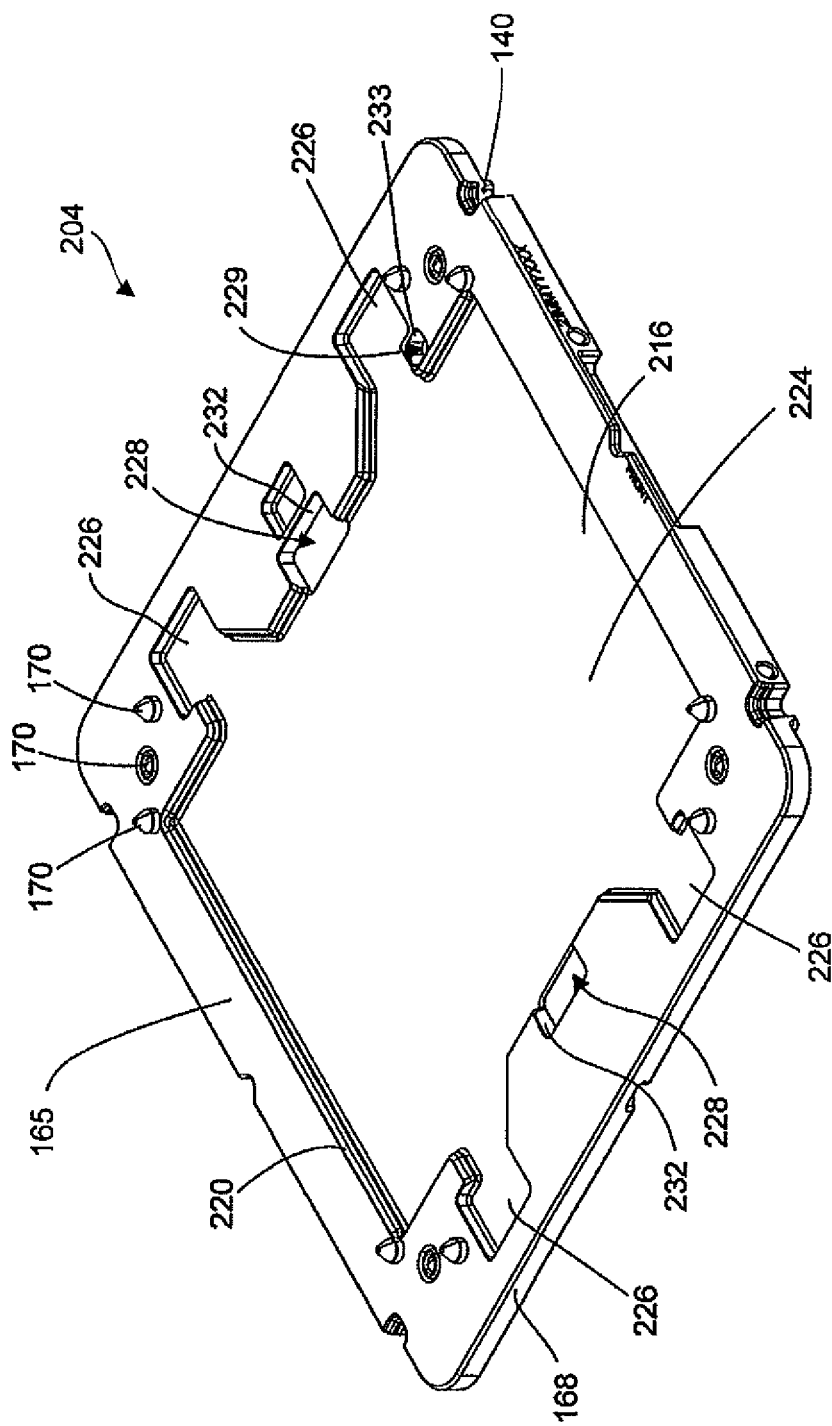
FIG. 2 depicts a top perspective view of a base for an inner pod assembly of a reticle container, according to one or more embodiments of the disclosure.
Figure 3:
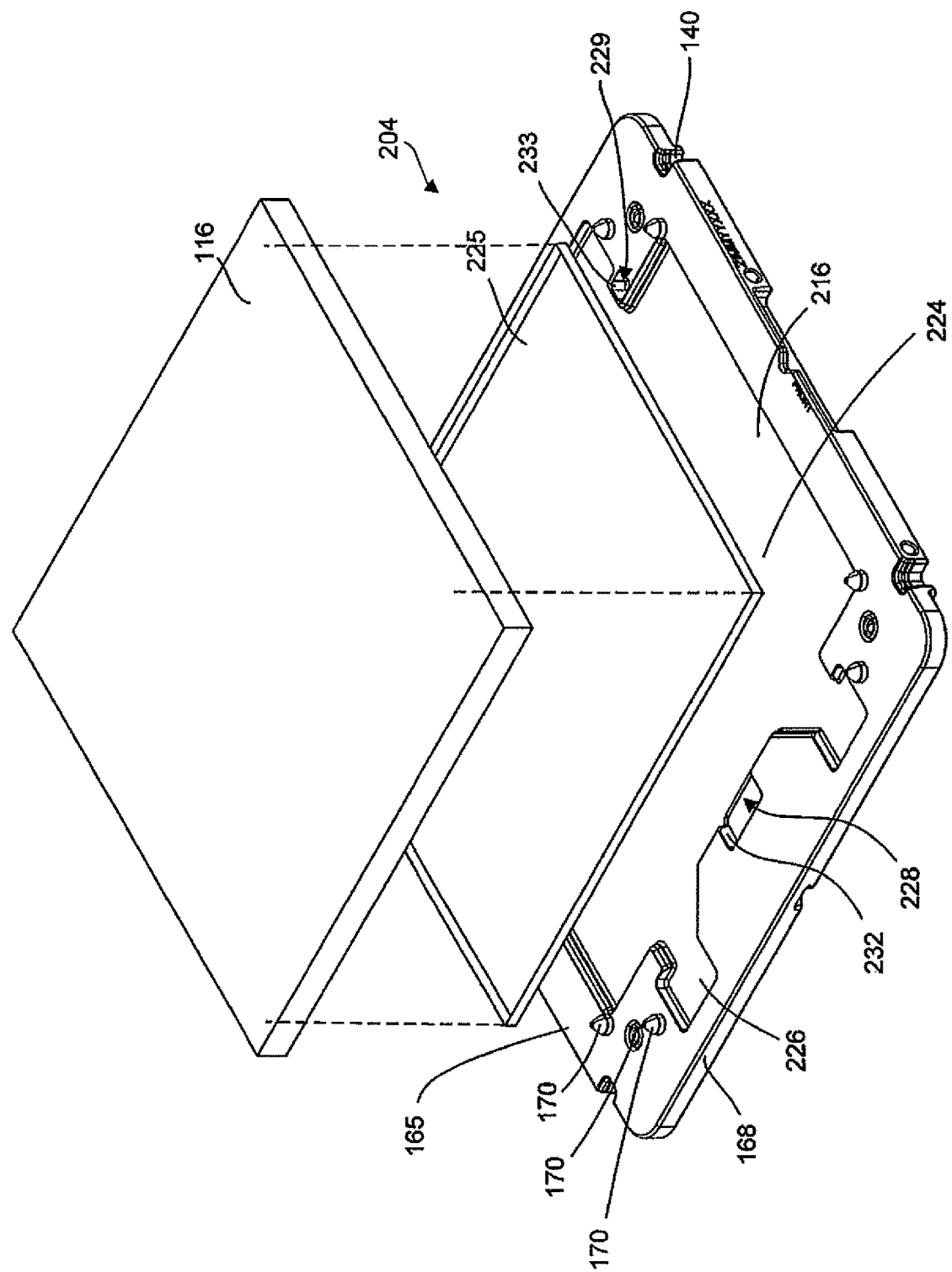
FIG. 3 depicts an exploded perspective view of a base for an inner pod assembly including a pellicle and a reticle, according to one or more embodiments of the disclosure.
Figure 4:
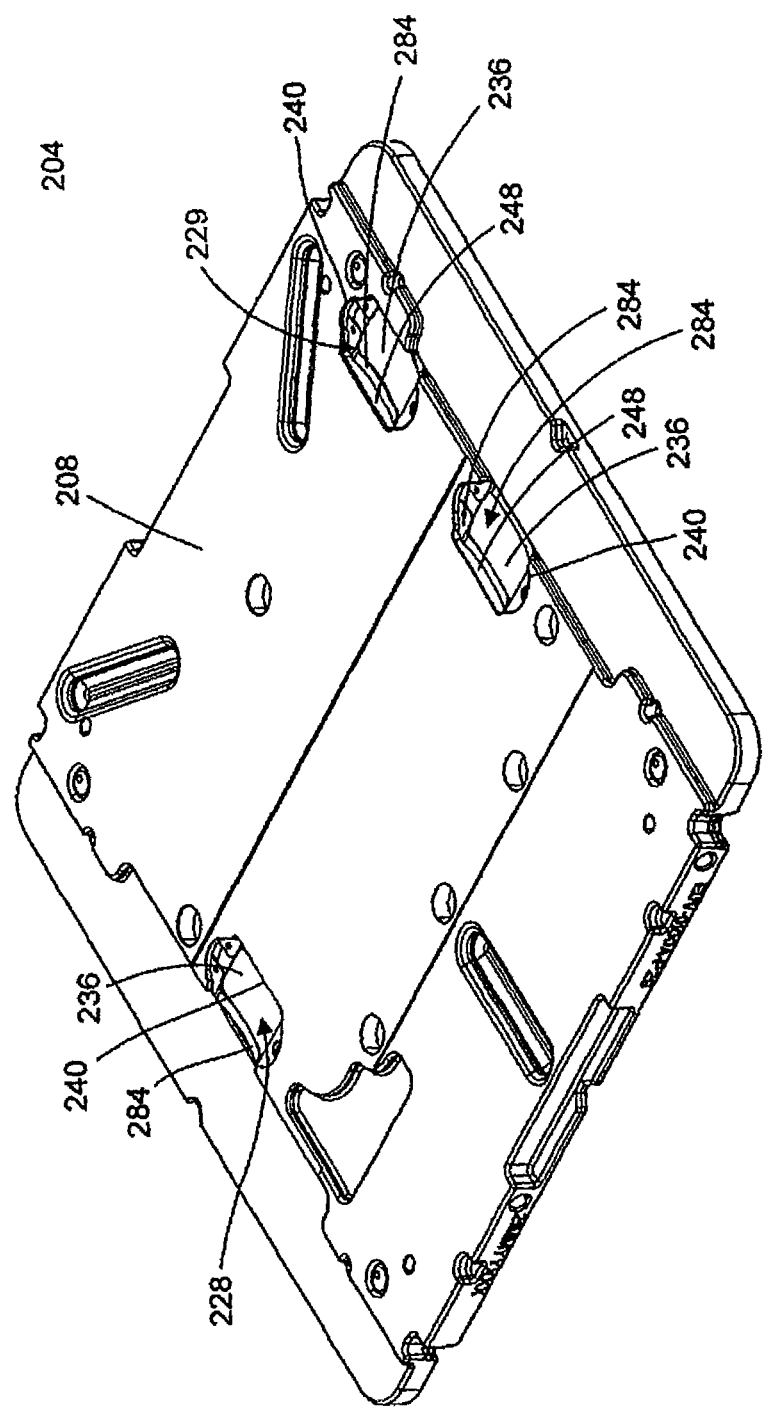
FIG. 4 depicts a bottom perspective view of a base for an inner pod assembly of a reticle container, according to one or more embodiments of the disclosure.

Referring to FIGS. 2-4 a base 204 for an inner pod assembly of a reticle container is depicted, according to one or more embodiments of the disclosure. In one or more embodiments, the base 204 has a unitary metallic construction and includes an upwardly-facing surface 165 opposite a downwardly-facing surface 208 with a lateral surface 168 extending therebetween. The base 204 additionally includes a plurality of reticle support members 170 extending from on the upwardly-facing surface 165 for supporting a reticle 116. In certain embodiments the base 204 includes one or more guide recesses 140 receding inward from the lateral surface 168 for alignment of the base 204 with a cover such as, for example, cover 128 shown in FIG. 1.

In one or more embodiments, the base 204 includes a pellicle mounting recess 216 defined in the upwardly facing surface 165. The pellicle mounting recess 216 includes a recess sidewall 220 and a bottom sidewall 224 that defines a shape for receiving and supporting a pellicle at least partially within the recess 216. In one or more embodiments the base 204 additionally includes gripping regions 226 at various points around the periphery of the pellicle mounting recess 216 for facilitating the insertion and/or removal of a pellicle from recess 216. In various embodiments, the recess sidewall 220 and the bottom sidewall 224 define a shape that conforms to the shape of a pellicle for positioning the pellicle in the recess 216.

FIG. 3 is an exploded view of the base plate 204, a pellicle 225 and a reticle 116, according to one or more embodiments. The pellicle 225 is positioned beneath the reticle 116 and can be lowered downwardly to lie within the pellicle mounting recess 216. In various embodiments, the depth of the recess 216 is substantially the same as the height of the pellicle 225 such that when lowered into the recess 216 the pellicle is substantially flush with the upwardly facing surface 165 and the reticle 116 contacts the support members 170 to support the reticle in place just over the base plate 204 and pellicle 225 combination. In certain embodiments, the depth of the recess 216 can vary, such that the depth of the recess 216 is greater than or less than the height of the pellicle 225.

Figure 5:
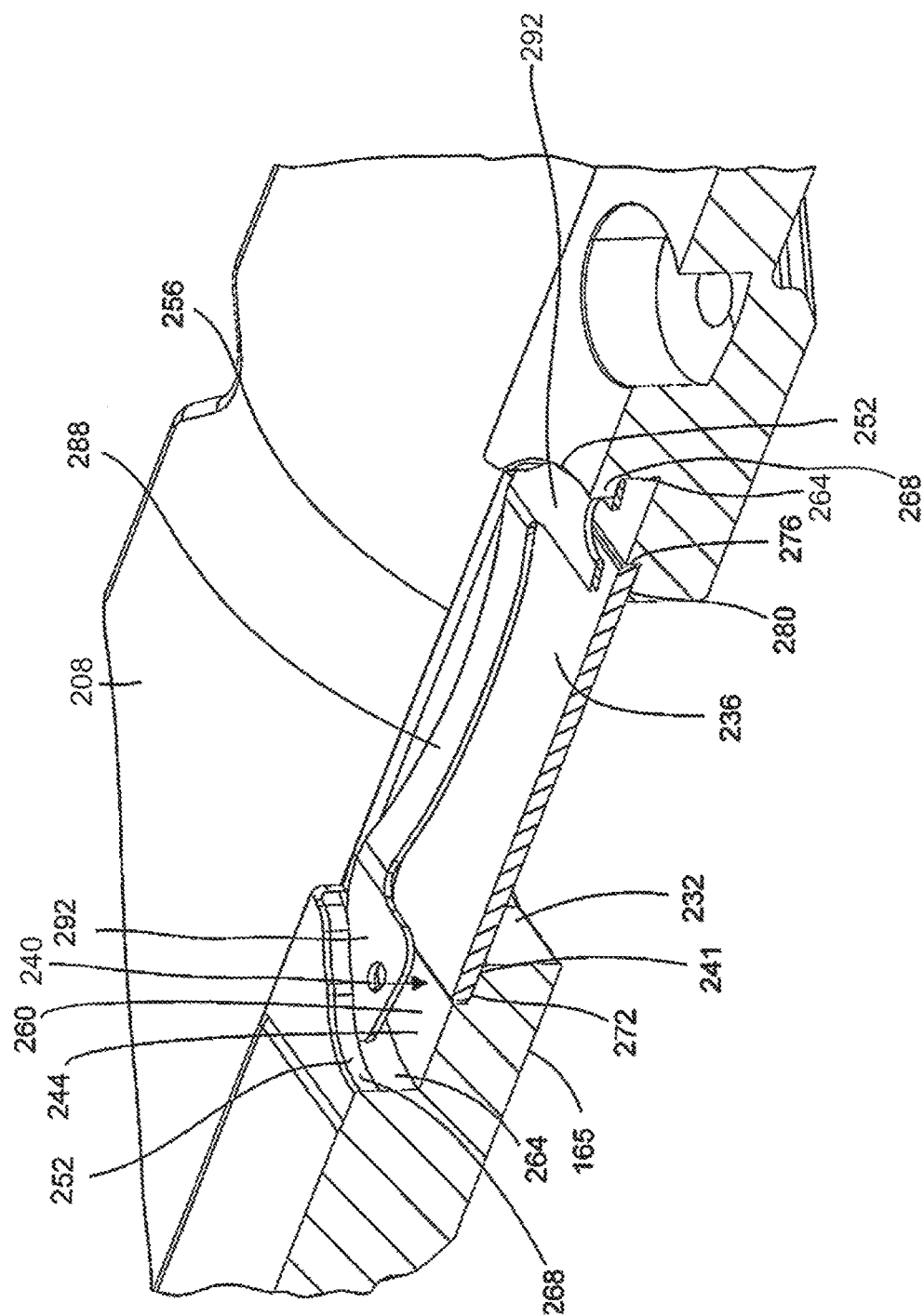
FIG. 5 depicts a cross sectional view of a window mounting recess including a transparent substrate and a window retention member, according to one or more embodiments of the disclosure.
Figure 6:
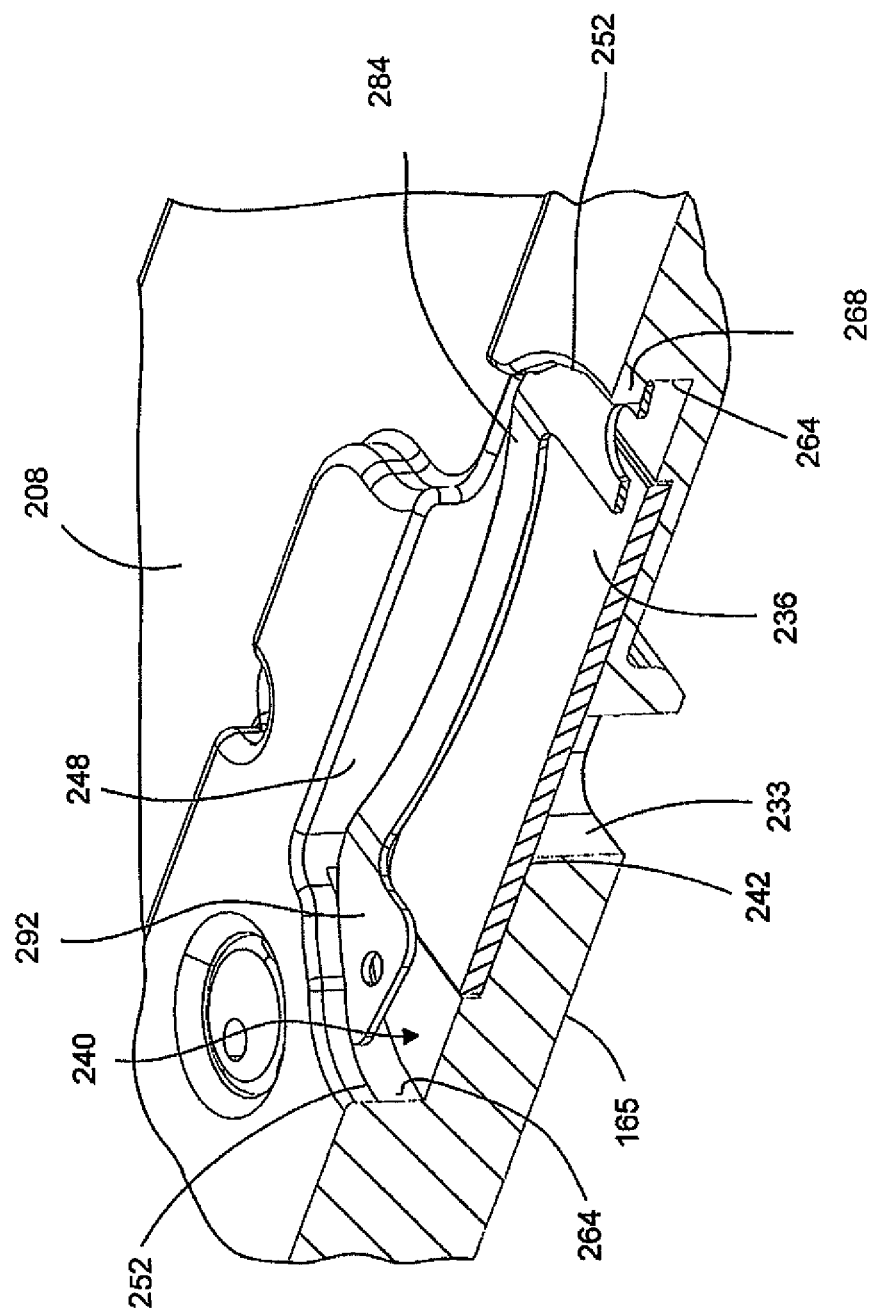
FIG. 6 depicts a cross sectional view of a window mounting recess including a transparent substrate and a window retention member, according to one or more embodiments of the disclosure.

Referring now to FIGS. 4-6, in various embodiments the base plate 204 additionally includes a plurality of windows 228, 229. Each of the windows 228, 229 includes a window mounting recess 240 defining an aperture 232, 233 extending through the base plate 204 and a transparent substrate 236. In various embodiments, each of the plurality of apertures 232, 233 extend through the base plate 204 from the downward facing surface 208 to the upwardly facing surface 165. In various embodiments, each of the transparent substrates 236 are disposed a corresponding window mounting recesses 240 defined in the base plate 204. In various embodiments, a spring-like retention member 284 retains the transparent substrates 236 in the window mounting recesses 240. In one or more embodiments, the transparent substrates 236 are made of transparent glass, plastic, or other suitable material for processing in a highly controlled processing environment such as that required for EUV photolithography.

In some embodiments, such as depicted in FIGS. 5 and 6, the window mounting recesses 240 each include a first recess 244 which is defined by a first recess sidewall 248, having a pair of widthwise edges 252 and a pair of lengthwise edges 256, and a first bottom sidewall 260. In some embodiments, one or more of the widthwise edges 252 includes an undercut portion 264 formed from a lateral recess within the first recess sidewall 248 that defines an overhang 268.

In certain embodiments, the window mounting recesses 240 each include a second recess 272 in the first bottom sidewall 260. The second recess 272 is defined by a second recess sidewall 276 and a second bottom sidewall 280. In one or more embodiments, the second recess sidewall 276 and the second bottom sidewall 280 define a shape for closely receiving the transparent substrates 236 at least partially within the second recess 272.

In one or more embodiments, the apertures 232, 233 can be formed having various sizes depending upon the size/type of the window 228, 229. For example, depicted in FIGS. 4-6, windows 228 are alignment windows for reticle positioning check during processing. Thus, apertures 232 are larger, relative to aperture 233, for improved viewing through the base plate 204 into the inner pod assembly. However, each of the apertures 232, 233 area at least sized smaller than the area of the second bottom sidewall 280 such that the apertures 232, 233 and the second bottom sidewall 280 define a lip 241, 242, in the window mounting recesses 240 that is sufficient to support the transparent substrate 236. For example, depicted in FIGS. 5-6, the transparent substrate 236 in each of the window mounting recesses 240 is supported by a lip having an edge supporting the corresponding edges of the transparent substrate 236.

Figure 9:
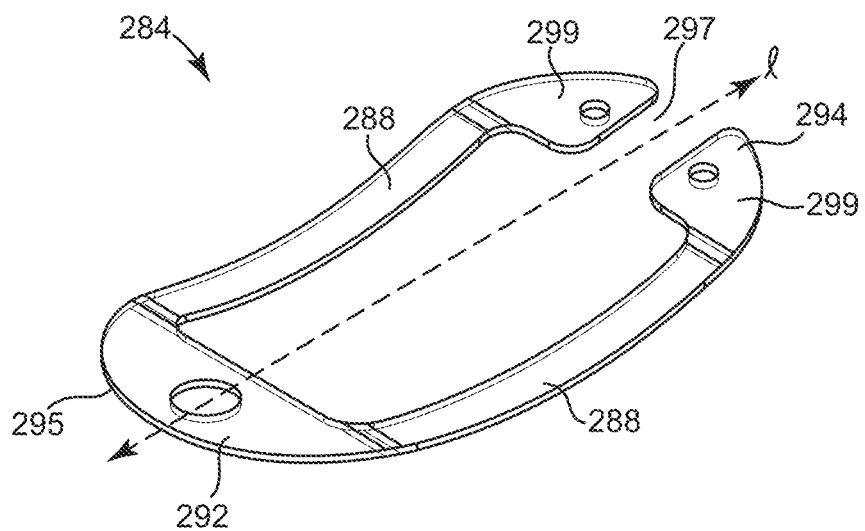
FIG. 9 depicts an isolation view of a retention member according to one or more embodiments of the disclosure.
Figure 10:
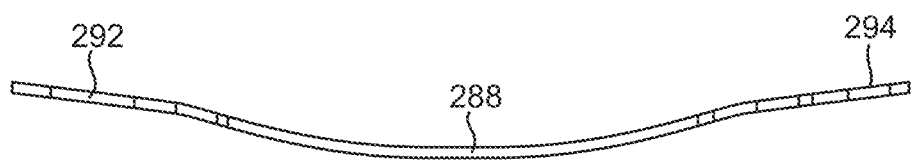
FIG. 10 depicts a side view of the retention member of FIG. 9.

In one or more embodiments, the base 204 includes a plurality of window retention members 284. Different views of an exemplary window retention member is shown in FIGS. 9 and 10. The window retention members 284 have suitable shape and size to snap fit, spring fit, screw fit, or otherwise be positioned and secured within the first recess 260 to retain the transparent substrate 236 in place in the second recess 272. In some embodiments, the window retention members 284 are configured so as to retain the transparent substrate 236 within the window mounting recess 240 using spring forces. For example, referring to FIGS. 5-6 and 9-10, each of the window retention members 284 have a pair of lengthwise arcuate portions 288 extending from a first end portion 292 to a second end portion 294. As can be seen in FIG. 9, the first end portion 292 has a closed distal end 295 and the second end portion includes a gap 297 separating the distal ends 299 of the arcuate portions 288. The gap 297 is provided between the distal ends 299 of the arcuate portions so that the retention member 284 can be compressed in a direction towards a center line 1 of the retention member during installation, as will be described in greater detail herein. Each of the first and second end portions 292, 294 can be positioned in the undercut portions 264 of each of the window mounting recesses 240, thereby securing the window retention member 284 in place via the overhangs 268. Once in place, the lengthwise arcuate portions 288 curve to contact the transparent substrate 236 to retain it in place in the second recess 272.

In one or more embodiments, the window retention members 284 are installable into the first recess by suitably bending one or more of the first and second end portions 292, 294 of the retention member 284 into the undercut portions 264. In one or more embodiments, the window retention members 284 are constructed using material having the properties of spring such that, once the members 284 are released from being bended into the undercut portions 264, they spring back to their original shape, thereby bringing the lengthwise arcuate portions 288 in contact with the transparent substrate 236. More particularly, in some embodiments, the window retention members 284 can be fabricated from a resilient material having a modulus of elasticity (E) of about 15 psi×103 to about 30 psi×103 such that the retention member 240. Accordingly, in various embodiments the window retention members 284 can be constructed from a material including, but not limited to spring steel, medium carbon steel, high carbon steel, stainless steel, non-ferrous alloys, and high-temperature alloys. In other embodiments, certain polymers having a suitable modulus elasticity sufficient for bending and maintaining a desired form can be used to fabricate the window retention members 284. Suitable polymeric materials include, but are not limited to perfluoroalkoxy alkane, polytetrafluoroethylene, polyetherimide, and polydimethylsiloxane. In one embodiment, the window retention members 284 are fabricated from spring steel.

Figure 7:
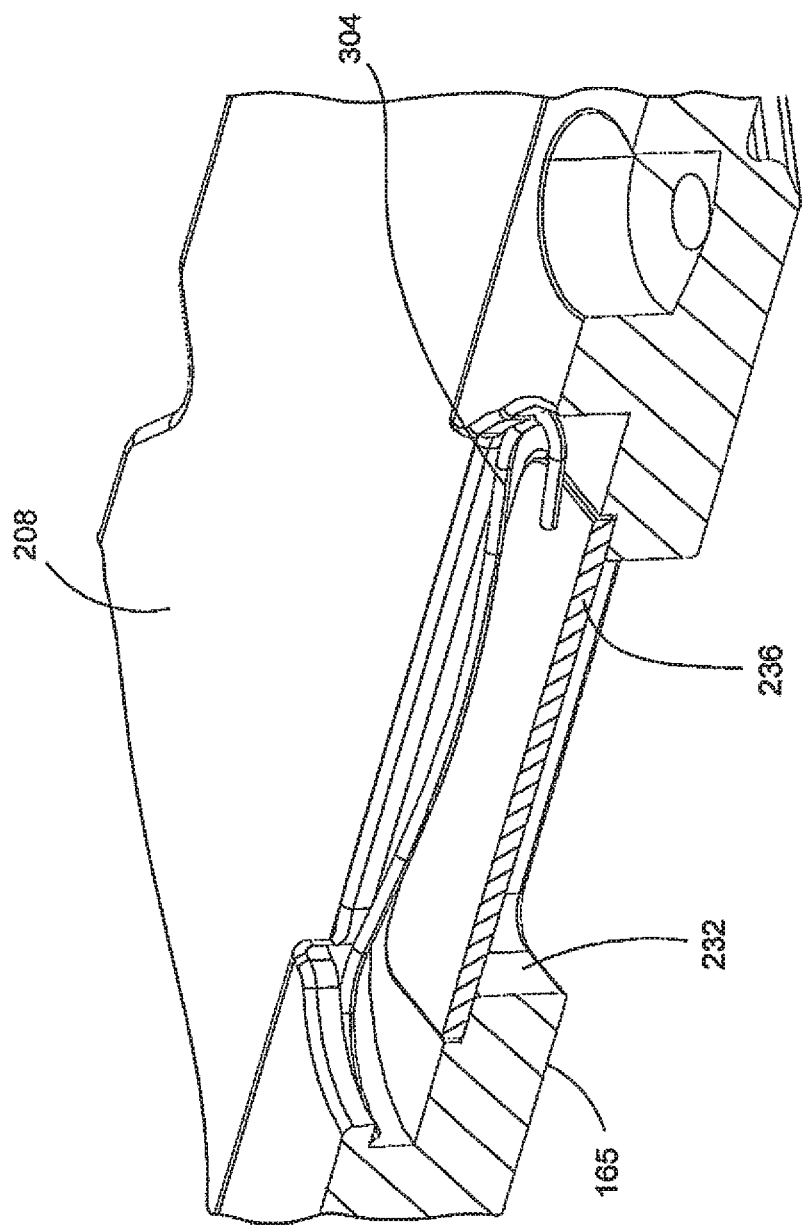
FIG. 7 depicts a cross sectional view of a window mounting recess including a transparent substrate and a window retention member, according to one or more embodiments of the disclosure.
Figure 8:
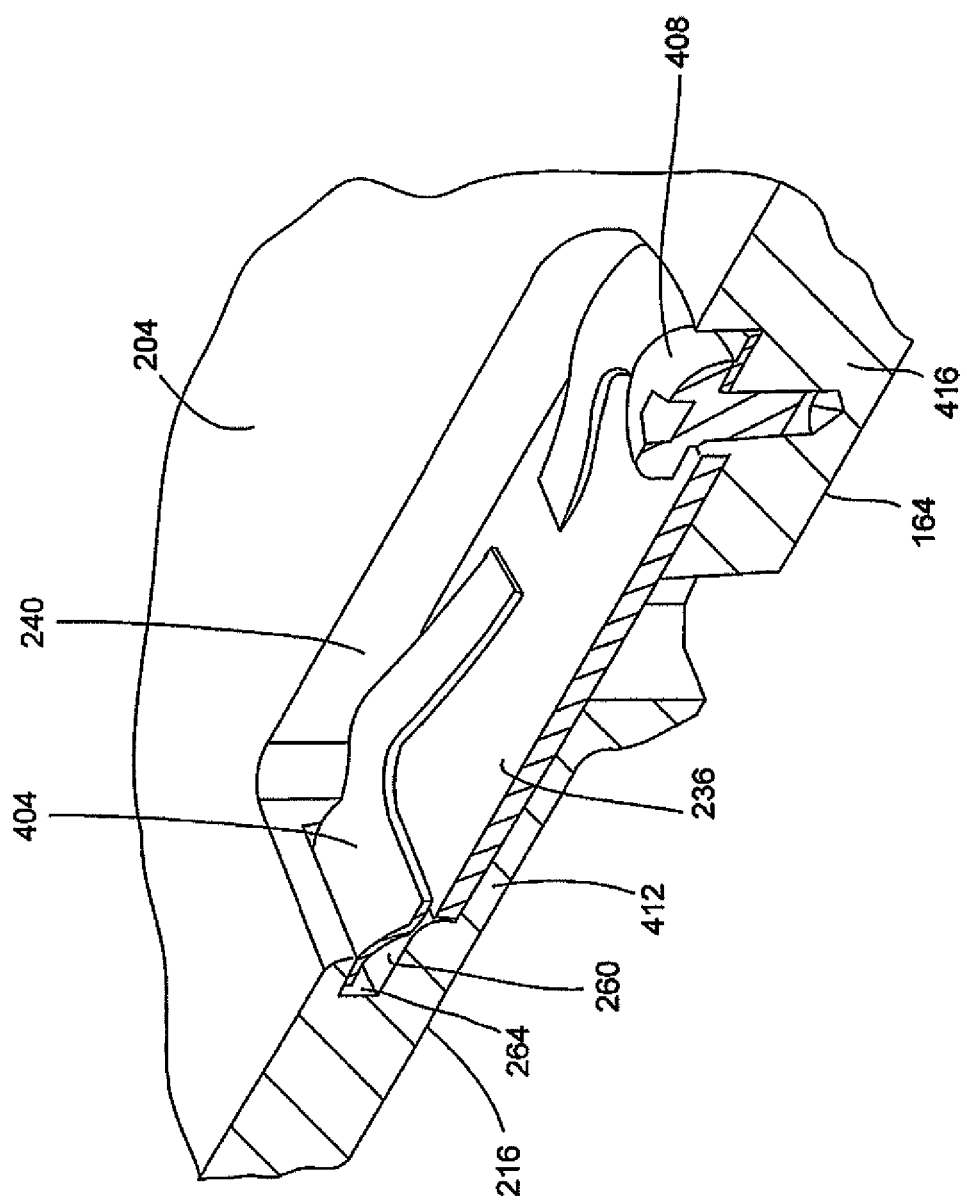
FIG. 8 depicts a cross sectional view of a window mounting recess including a transparent substrate and a window retention member, according to one or more embodiments of the disclosure.

The window retention members can be constructed having various shapes or designs. For example, referring to FIG. 7 a cross section view of a window retention member 304 is depicted. The window retention member 304 is constructed from a resilient wire of a metal or polymeric material having a modulus of elasticity (E) of about 15 psi×$10^3$ to about 30 psi×$10^3$ such that as those disclosed herein. In one embodiment, the window retention member is 304 is fabricated from spring steel. Referring to FIG. 8, a window retention member 404 is depicted. In one or more embodiments, the window retention member 404 is partially screw retained, having one of the widthwise edges positioned in an undercut portion 264 of the first recess 260 and having another one of the widthwise edges secured in place via a screw 408 into the base plate 204.

In one or more embodiments, due to the pellicle mounting recess 216, the window mounting recess 240 is positioned having a portion positioned over a relatively thinner region 412 of the base plate 204 and another portion positioned over a relatively thicker region 416 of the base plate 204. Due to the lack of base plate material, the thinner region 412 prevents the use of conventional retention methods, such as the screw 408. Accordingly, in various embodiments the undercut portion 264 is positioned in the recess sidewall that corresponds to the thinner region 412. In some embodiments the window retention member 404 has a first widthwise edge positioned in the widthwise edge 264 that corresponds to the thinner region 412 and has a second widthwise edge secured in place to the base plate 204 via a screw 408 positioned in the thicker region 416 of the base plate 204.

Each of the window retention members 284, 304, 404 rely on, at least in part, compressive spring forces to retain the transparent substrate within the window mounting recess. During construction of the base plate, a transparent substrate can be placed within one of the mounting recesses defined within the base plate. Next, the first end portion of a retention member can be inserted into a first undercut defined in the first recess sidewall of the window mounting recess. The second end portion is the compressed or squeezed in a direction towards a center line of the retention member and inserted into a second undercut defined in a second recess side wall of the mounting recess. Once positioned in the undercut, the second end portion of the retention member is released, causing the retention member to spring back to its original shape thereby causing the one or more arcuate members to contact and place a compressive force onto the transparent substrate, retaining the transparent substrate within the mounting recess. This process may be repeated as necessary for each window in the base plate.

Relying on compressive forces to retain the transparent member within the window mounting recess, reduces or, in some embodiments, eliminates other fastening means such as, for example, screws, that are typically utilized to retain the substrate within the window mounting recess. The reduction in the number of screws or the elimination of screws or other fastens may help to reduce particles within the sensitive microenvironment.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A substrate container comprising:
    a reticle container having a base plate and a cover, the cover adapted to engage the base plate defining an enclosure, the base plate including at least one window having:
    a mounting recess including a first recess sidewall, a bottom sidewall, and an undercut defined second recess sidewall, wherein together the first recess sidewall and the bottom sidewall define a lip,
    a transparent substrate disposed in the mounting recess and supported on the lip, and
    a retention member having an arcuate portion extending between a first end portion and a second end portion, wherein the first end portion is positioned in the undercut defined in the recess sidewall and the arcuate portion of the retention member contacts the transparent substrate to retain the transparent substrate in the mounting recess and wherein the retention member is constructed from a material having a modulus of elasticity (E) of about 15 psi×$10^3$ to about 30 psi×$10^3$.

2. The substrate container of claim 1, wherein the mounting recess further comprises:
    a first recess defined by a first recess sidewall and a first bottom sidewall; and
    a second recess in the first bottom sidewall of the first recess, the second recess defined by a second recess sidewall and a second bottom sidewall, the second recess sidewall and the second bottom sidewall defining a shape for receiving the transparent substrate at least partially within the second recess; and
    wherein the second bottom sidewall defines the lip in the mounting recess that supports the transparent substrate.

3. The substrate container of claim 1, wherein the material is selected from the group consisting of spring steel, medium carbon steel, high carbon steel, stainless steel, non-ferrous alloys, high-temperature alloys.

4. The substrate container of claim 1, wherein the material is selected from the group consisting of perfluoroalkoxy alkane, polytetrafluoroethylene, polyetherimide, and polydimethylsiloxane.

5. The substrate container of claim 1, wherein the retention member is constructed from spring steel.

6. The substrate container of claim 1, wherein the second end portion of the retention member is secured to the base plate.

7. The substrate container of claim 6, wherein the second end portion of the retention member is secured to the base plate via a screw.

8. The substrate container of claim 1, wherein the mounting recess further includes a pair of opposing recess side walls and each of the pair of opposing recess sidewalls includes an undercut defined therein.

9. The substrate container of claim 8, wherein the second end portion of the retention member is positioned in a second undercut defined in an opposing recess sidewall of the pair of opposing recess sidewalls.

10. The substrate container of claim 8, wherein the undercut portions defined in each of the recess sidewalls further define an overhang.

11. The substrate container of claim 10, wherein each of the first and second end portions of the retention member are positioned in the undercut portions defined in the recess sidewalls and retained in place via the overhangs.

12. The substrate container of claim 1, the window further comprising an aperture defined in the bottom sidewall of the mounting recess.

13. The substrate container of claim 1, wherein a size and shape of the mounting recess corresponds to the size and shape of the transparent substrate disposed therein.

14. The substrate container of claim 1, further comprising two or more windows.

15. The substrate container of claim 1, further comprising an outer pod an outer pod including an upper portion configured to mate with a bottom portion defining an outer enclosure, wherein the base plate and cover are contained within the outer enclosure defined by the outer pod.

* * * * *